(12) United States Patent
Tran et al.

(10) Patent No.: US 12,019,526 B2
(45) Date of Patent: Jun. 25, 2024

(54) LOCK-STEPPING ASYNCHRONOUS LOGIC

(71) Applicant: XILINX, INC., San Jose, CA (US)

(72) Inventors: David Tran, San Jose, CA (US); Aditi R. Ganesan, San Jose, CA (US); Anurag Goyal, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 230 days.

(21) Appl. No.: 17/746,843

(22) Filed: May 17, 2022

(65) Prior Publication Data

US 2023/0376389 A1   Nov. 23, 2023

(51) Int. Cl.
*H03L 7/081* (2006.01)
*G06F 11/16* (2006.01)

(52) U.S. Cl.
CPC ........ *G06F 11/1679* (2013.01); *H03L 7/0814* (2013.01)

(58) Field of Classification Search
None
See application file for complete search history.

(56) References Cited

U.S. PATENT DOCUMENTS

2019/0340054 A1* 11/2019 Boettcher ........... G06F 11/1637

* cited by examiner

*Primary Examiner* — Cassandra F Cox
(74) *Attorney, Agent, or Firm* — Patterson + Sheridan, LLP

(57) ABSTRACT

Methods and systems to detect a metastable condition and suppress/mask a signal during the metastable condition. The metastable condition may arise from asynchronous sampling. Techniques disclosed herein may be configured to enable asynchronous lock-stepping, where outputs of redundant circuit blocks of a first clock domain are received at input nodes of a second clock domain. In the second clock domain, logic states at the input nodes are compared to detect errors, and results of the comparison are masked during transitions at the input nodes. Masking may be constrained to situations where logic states at the input nodes differ.

20 Claims, 9 Drawing Sheets

LOCK-STEPPING ASYNCHRONOUS LOGIC

TECHNICAL FIELD

Examples of the present disclosure generally relate to lockstep asynchronous circuits.

BACKGROUND

Lockstep is a technique to provide redundancy for one or more of a variety of purposes, such as availability (i.e., uninterrupted operation in the presence of faults) or functional safety. Functional safety standards include ISO-26262, "Road Vehicles Functional Safety Package, promulgated by the International Organization for Standardization (ISO), based in Geneva, Switzerland, and IEC 61508, "Electronic Functional Safety Package," promulgated by the International Electrotechnical Commission (IEC), based in Geneva, Switzerland.

In a lockstep system, outputs of multiple redundant circuit blocks are compared. A mismatch amongst the outputs is interpreted as a fault within one or more of the or circuit blocks.

Conventional lockstep systems are incompatible with circuits that span asynchronous clock domains (i.e., where redundant signals launched from a source dock are sampled by a destination dock before being used in the destination dock domain). In such an asynchronous environment, there is inherent uncertainty as to when the sampler outputs will complete a transition from one logic state to another. This is due to metastable/random settling times when signals are docked asynchronously. As a result, ostensibly identical redundant signals may not transition in unison. A mismatch amongst logic states of the signals during such a metastable condition, however brief, may be mistakenly interpreted as an error in the redundant circuit blocks.

SUMMARY

Techniques to detect a metastable condition and mask a signal during the metastable condition are disclosed herein.

One example is an apparatus that includes circuitry that generates a mismatch control signal indicating when logic states at first and second input nodes differ from one another, a metastable condition detection circuit that detects a metastable condition at the first and second input nodes, and a mask circuit that selectively masks the mismatch control signal based on an output of the metastable condition detection circuit.

Another example is an integrated circuit device that includes a first circuit block that operate under control of a first clock domain and a second circuit block that operates under control of a second clock domain. The first circuit block includes first and second synchronizers, each of which synchronizes a digital signal to the second dock domain. The second circuit block includes first and second input nodes that receive output of the first and second synchronizers, respectively. The second circuit block further includes a comparator that generates a mismatch control signal indicating when logic states at first and second input nodes differ from one another, a metastable condition detection circuit that detects a metastable condition at the first and second input nodes, and a mask circuit that selectively masks the mismatch control signal based on an output of the metastable condition detection circuit.

Another example is a method that includes generating a mismatch control signal indicating when logic states at first and second nodes differ from one another, detecting a metastable condition at the first and second nodes, and masking the mismatch control signal during the metastable condition.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
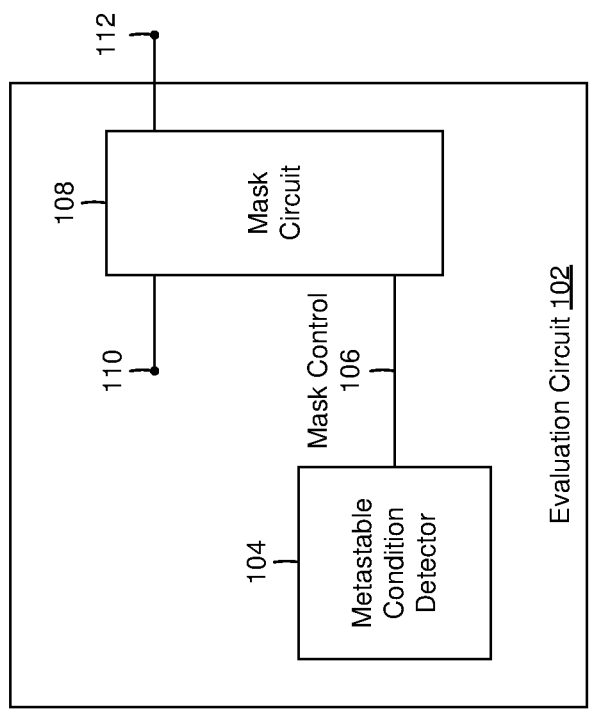
FIG. 1 is a block diagram of an evaluation circuit that includes a metastable condition detector that detects a metastable condition and generates a mask control when the metastable condition is detected, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques to apply or utilize lockstep redundancy in asynchronous environments.

In an embodiment, multiple redundant signals of a source clock domain are synchronized to a destination clock domain. The synchronized signals are compared to one another in the destination clock domain to generate a mismatch control signal.

A metastable condition within the source clock domain is indirectly detected in the destination clock domain based on characteristics of the redundant outputs of the source clock domain. The mismatch control signal is suppressed or masked during the metastable condition.

An asynchronous lockstep scheme may be configured wholly or predominantly within the destination clock domain, with little or no additional circuitry in the source clock domain. This may be useful in situations where it is impractical or infeasible to add metastable detection circuitry to the source clock domain.

FIG. 1 is a block diagram of an evaluation circuit 102, according to an embodiment. Evaluation circuit 102 includes a metastable condition detector 104 that detects a metastable condition and generates a mask control 106 when the metastable condition is detected. Metastable condition detector 104 may detect a metastable condition related to a signal 110.

Evaluation circuit 102 further includes a mask circuit 108 that selectively masks or suppresses signal 110 based on mask control 106. In the example of FIG. 1, mask circuit 108 outputs a selectively masked signal at an output 112.

Evaluation circuit 102 may be useful in one or more of a variety of situations or environments. For example, and without limitation, signal 110 may indicate a condition or warning when active. During a metastable condition, a logic state of signal 110 may be considered unreliable. In such a situation, it may be desirable to suppress or mask signal 110 during the metastable condition, such as to avoid taking potentially unnecessary action.

As another example, evaluation circuit 102 may be useful to evaluate multiple redundant signals (e.g., outputs of a lockstep system) across multiple time domains, examples of which are provided further below.

Evaluation circuit 102 is not limited to these example applications.

The term "metastable condition," as used herein, includes situations or times at which an outcome of an event is unpredictable. The unpredictability may arise from a temporary condition of instability of a signal or circuit. Example metastable conditions are described below with respect to asynchronous sampling. The examples are provided for illustrative purposes. Metastable condition detector 104 is not limited to detecting metastable conditions related to asynchronous sampling.

Figure 2:
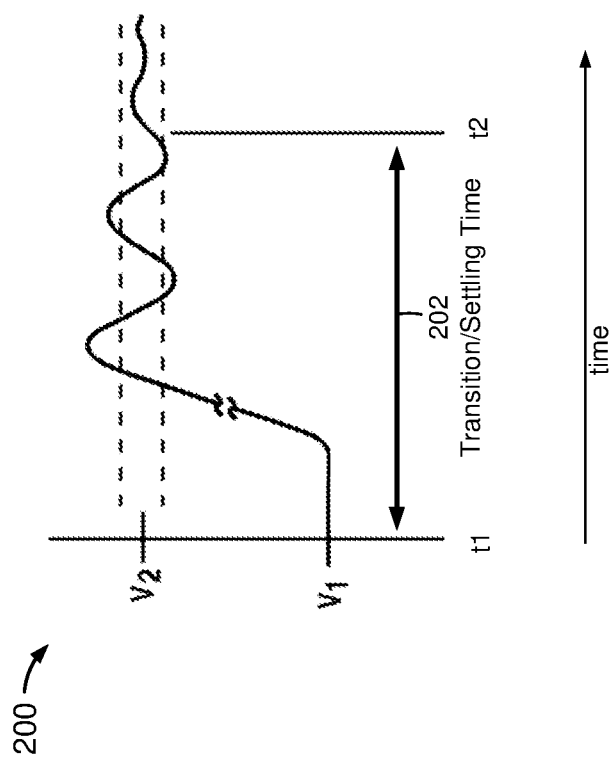
FIG. 2 is a timing diagram of a digital signal as it transitions from a first logic state to a second logic state.

FIG. 2 is a timing diagram of a digital signal 200. Prior to a time t1, signal 200 is at a first voltage V1, referred to herein as logic state 0. Between times t1 and t2 signal 200 transitions from first voltage V1 to a second voltage V2, referred to herein as logic state 1. The time between t1 and t2 is referred to herein as a transition/settling time 202.

Signal 200 may be sampled with a sampling circuit. The sampling circuit may include a buffer configured to output one of two voltage levels based on a sampled voltage of signal 200. The output voltages may be V1 and V2, or other voltages. For illustrative purposes, the output voltages are referred to herein as V1 and V2.

In this example, if signal 200 is sampled prior to t1, the sampler will output V1. If signal 200 is sampled after t2, the sampler will output V2. If signal 200 is sampled during transition/settling time 202, the sampler output is unpredictable, in that the output will depend on the exact time at which signal 200 is sampled, physics of the sampler, and/or environmental factors (e.g., temperature). In other words;

the exact time at which the sampler output switches from V1 to V2 may be unpredictable. Sampling of signal 200 within transition/settling time 202 is referred to herein as a metastable condition, or a condition of meta instability.

In FIG. 1, signal 110 may be derived from an asynchronous sampling system. In such a situation, times at which signal 110 transitions between logic states may correspond to metastable conditions of the asynchronous sampling system. To accommodate such metastable conditions, it may be desirable to mask or suppress signal 110 during metastable conditions.

Example embodiments of evaluation circuit 102 are provided below. Evaluation circuit 102 is not, however, limited to the examples below.

Figure 3:
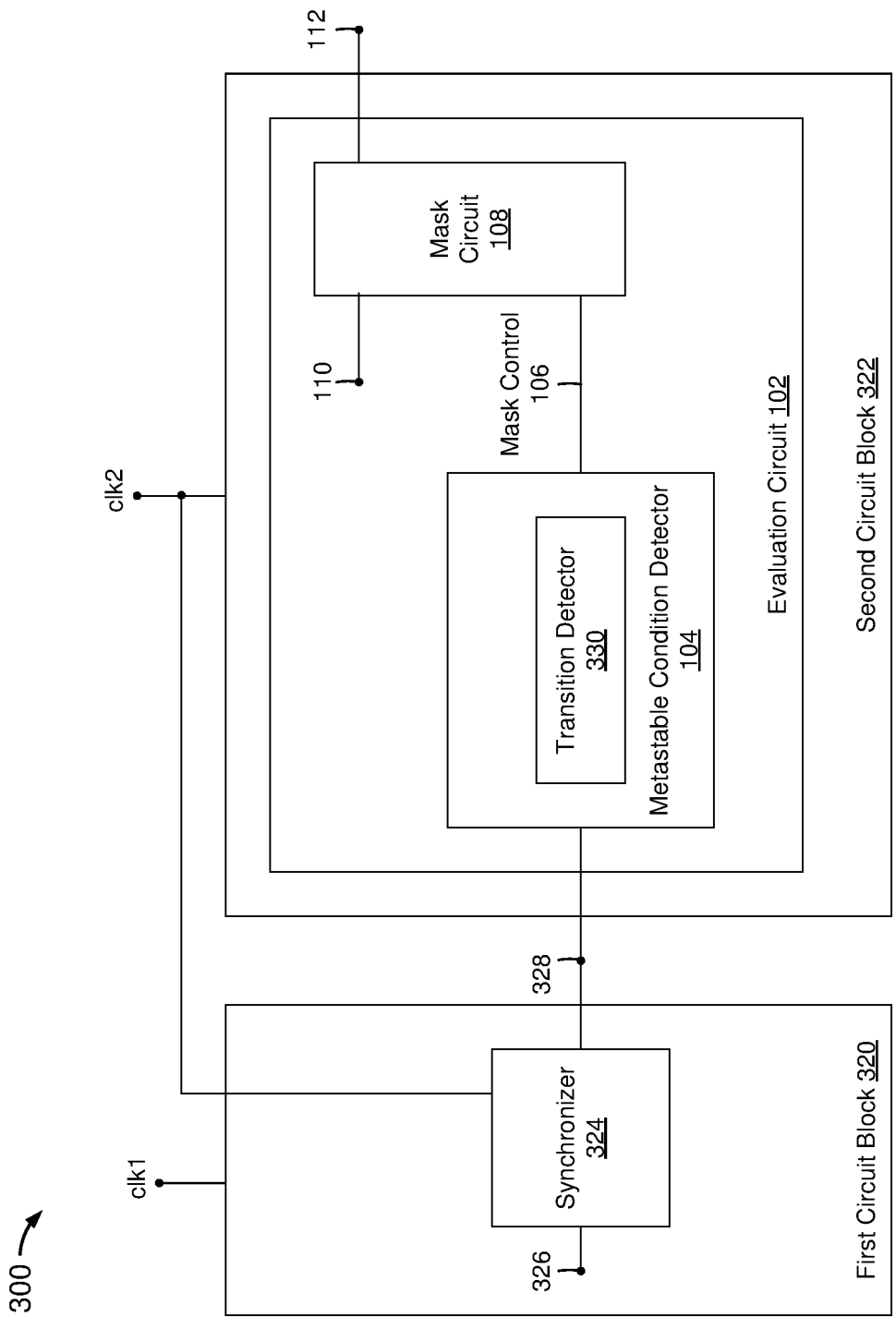
FIG. 3 is a block diagram of an asynchronous system, according to an embodiment.

FIG. 3 is a block diagram of an asynchronous system (system) 300, according to an embodiment. System 300 includes a first circuit block 320 that operates in a first clock domain based on a dock clk1. System 300 further includes a second circuit block 322 that operates in a second clock domain based on a clock clk2.

First circuit block 320 includes a synchronizer 324 that synchronizes a signal of the first clock domain at a node 326 to the second clock domain. Synchronizer 324 may include a sampler that samples the signal at node 326 based on clock clk2 (i.e., asynchronous sampling), and provides the synchronized signal to second circuit block 322 at a node 328.

As described above with respect to FIG. 2, synchronizer 324 may inadvertently or inherently sample the signal at node 326 during transition/settling times of the signal at node 326. Logic states at node 328 may be unreliable at such times.

In FIG. 3, second circuit block 322 includes an example embodiment of evaluation circuit 102. In this example, signal 110 may be related to (e.g., derived from) the signal at node 328, such that a logic state of signal 110 may also be unreliable at or near transitions of the signal at node 328. Since the metastable condition corresponds to transitions of the signal at node 326, the metastable condition is detectable as logic state transitions at node 328.

In FIG. 3, metastable condition detector 104 includes a transition detector 330 that detects logic state transitions at node 328. Transition detector 330 may include a rising edge and/or a falling edge detector that detects rising and/or falling edges of transitions at node 328.

In FIG. 1, mask circuit 108 may be configured in accordance with Table 1 below.

TABLE 1

| Mask Control 106 | Signal 110 | Output 112 |
| --- | --- | --- |
| Inactive | Active | Active |
| Inactive | Inactive | Inactive |
| Active | X | Inactive |

Definitions of active and inactive logic states are design choices. For example, and without limitation, signal 110 and mask control 106 may be normally low/active high, and masked signal at output 112 may be normally high/active low. Other arrangements will be readily apparent based on the description herein.

Mask circuit 108 may include a NOR gate to mask or suppress signal 110 an example of which is provided below with reference to FIG. 4.

Figure 4:
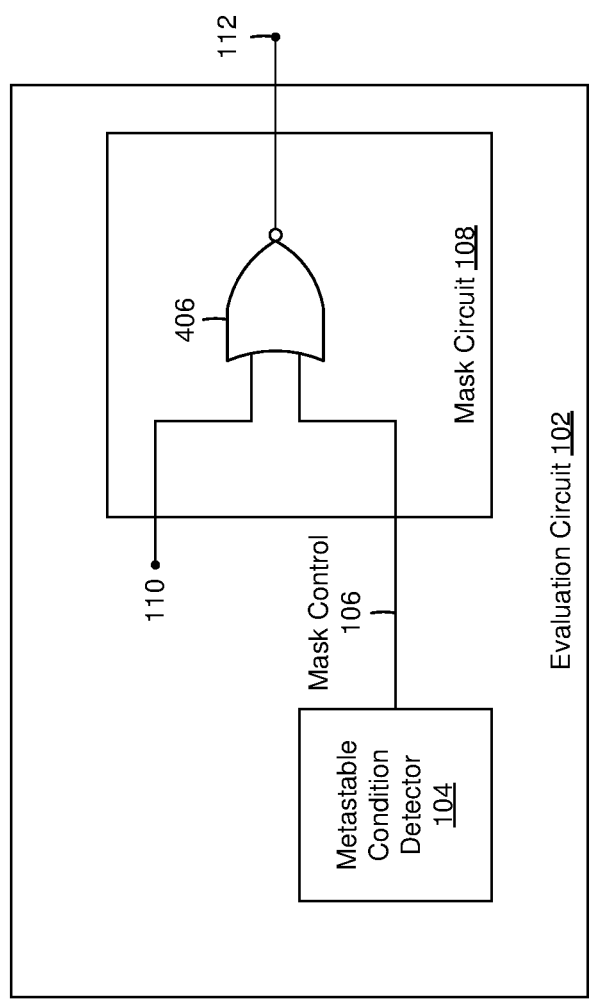
FIG. 4 is a block diagram of the evaluation circuit of FIG. 1, according to an embodiment.

FIG. 4 is a block diagram of evaluation circuit 102, according to an embodiment. In FIG. 4, mask circuit 108 includes a NOR gate 402 to implement Table 2, below.

TABLE 2

| Mask Control 106 | Signal 110 | Output 112 |
|---|---|---|
| 0 | 0 | 1 |
| 0 | 1 | 0 |
| 1 | X | 0 |

Mask circuit 108 is not limited to the example of Table 2.

In FIG. 1, evaluation circuit 102 may evaluate outputs of multiple redundant circuit blocks, such as in a lockstep system, examples of which are provided below. Multiple-input embodiments of evaluation circuit 102 are not, however, limited to the examples below.

Figure 5:
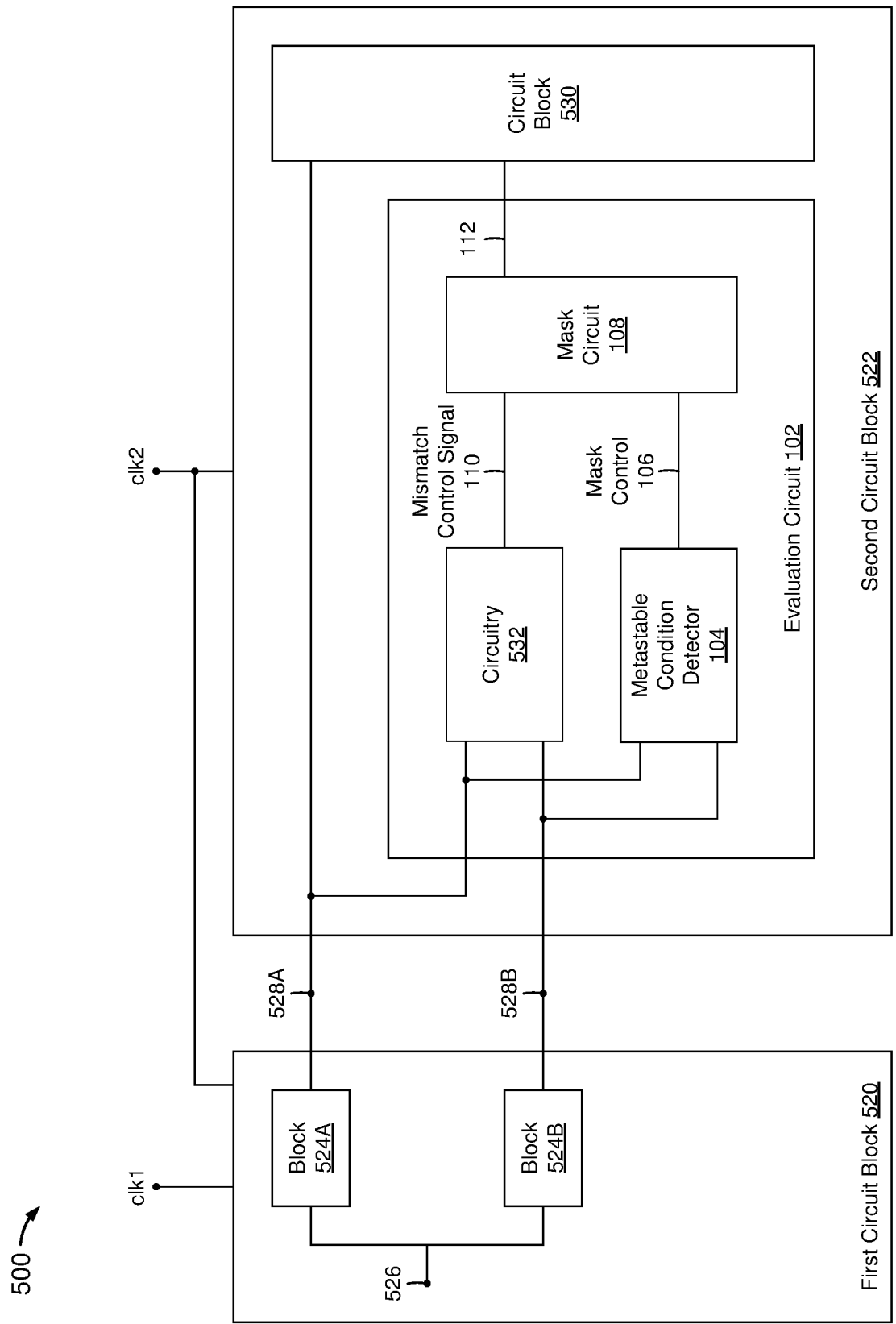
FIG. 5 is a block diagram of an asynchronous lockstep system, according to an embodiment.

FIG. 5 is a block diagram of an asynchronous lockstep system (system) 500, according to an embodiment. System 500 includes a first circuit block 520 that operates at a first clock rate clk1, or a derivative thereof. System 500 further includes a second circuit block 522 that operates at a second clock rate clk2, or a derivative thereof.

First circuit block 520 includes first and second redundant or duplicate circuit blocks 524A and 5246 that output redundant signals or controls at respective nodes 528A and 5286. Circuit blocks 524A and 524B may each include a respective synchronizer that synchronizes a signal at a node 526 to clk2, and outputs the synchronized signal at a respective one of nodes 528A and 5286. The signals at nodes 528A and 528B may represent data and/or a control.

Second circuit block 522 includes evaluation circuit 102. In the example of FIG. 5, evaluation circuit 102 evaluates the signals at nodes 528A and 5286 for indications of errors within circuit blocks 524A and 524B.

Second circuit block 522 further includes a circuit block 530 that receives the data or control from one or more of nodes 528A and 5286.

Circuit block 530 may include circuitry that takes remedial action when an error is detected by evaluation circuit 102.

Absent an error or metastable condition in one or more of circuit blocks 524A and 5246, logic states at nodes 528A and 528B are substantially identical to one another (e.g., transition between logic states in unison), A mismatch amongst logic states at nodes 528A and 5286 may be due to an error within one or more of circuit blocks 524A and 5246 or a temporary/transitory metastable condition within circuit blocks 524A and 524B.

A metastable condition may arise within circuit blocks 524A and 5246 when the signal at node 526 is asynchronously sampled during transitions, such as described above with reference to FIG. 2, During such a metastable condition, logic states at nodes 528A and 5286 may temporarily differ from one another (e.g., signals at nodes 528A and 5286 may not transition in unison). The mismatch may dissipate as the signals at nodes 528A and 528B fully transition to a new logic state, possibly as soon as a subsequent cycle or period of clk2.

A mismatch due to metainstability, however brief, may be mistakenly interpreted as an error, which may prompt unnecessary remedial measures. To avoid such as situation, evaluation circuit 102 ignores mismatches that are detected at nodes 528A and 528B during metastable conditions.

In the example of FIG. 5, evaluation circuit 102 includes circuitry 532 that generates signal 110 indicating when logic states at nodes 528A and 5286 differ from one another, Circuitry 532 may include a comparator that compares the logic states at nodes 528A and 528B. In this example, signal 110 may be referred to as a mismatch control signal 110

Further in the example of FIG. 5, metastable condition detector 104 detects a metastable condition at nodes 528A and 528B and generates or activates mask control 106 when the metastable condition is detected. Metastable condition detector 104 may detect the metastable condition based on logic state transitions at nodes 528A and 528B.

In an embodiment, metastable condition detector 104 activates mask control 106 when a logic state transition is detected at one or more of nodes 528A and 528B and the logic states at nodes 528A and 5283 differ from one another. This may be useful to avoid unnecessarily activating mask control 106 when there is no mismatch amongst nodes 528A and 5286.

Figure 6:
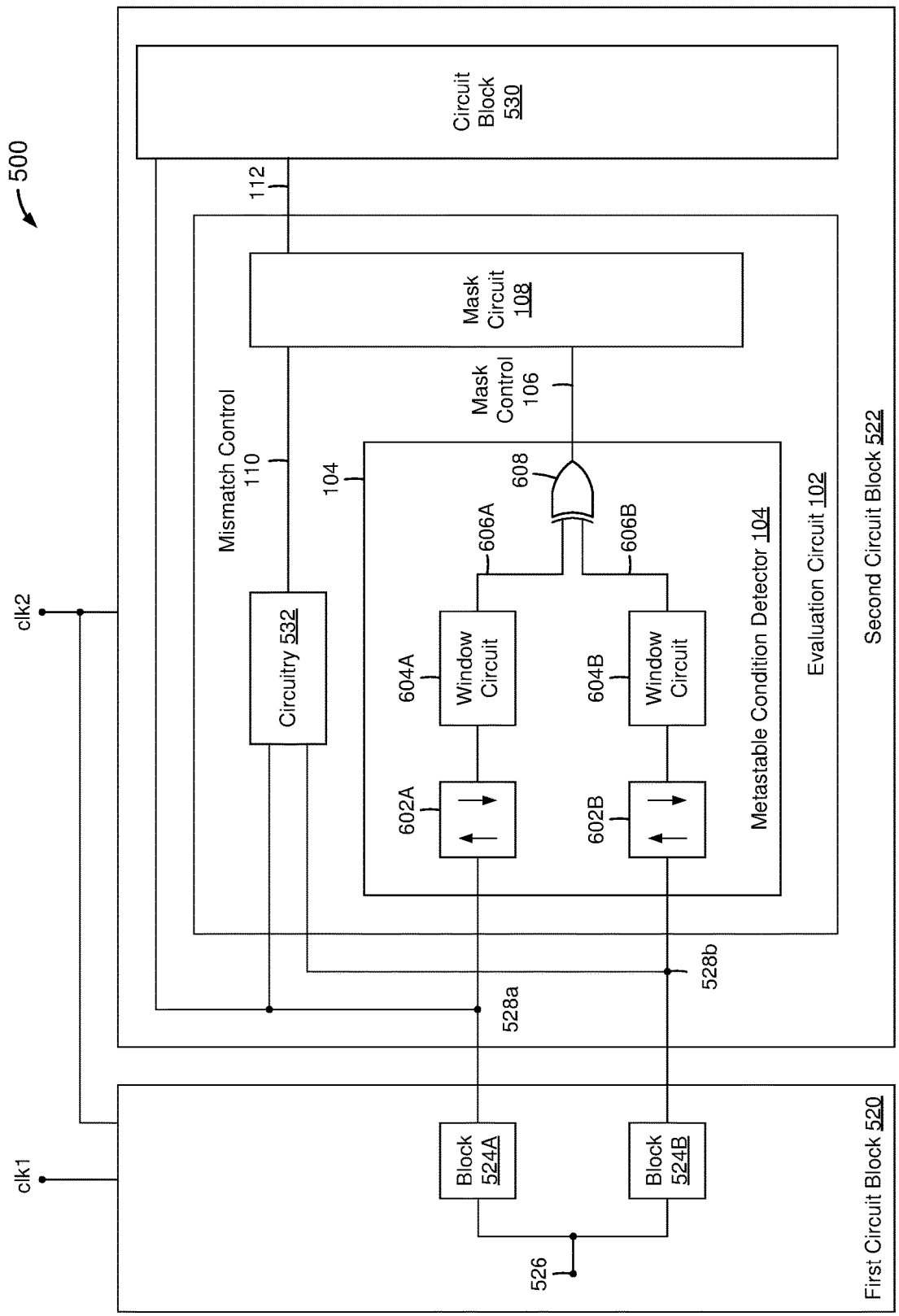
FIG. 6 is a block diagram of the asynchronous lockstep system of FIG. 5, according to an embodiment.

FIG. 6 is a block diagram of asynchronous system 500, according to an embodiment. In FIG. 6, metastable condition detector 104 includes transition detectors 602A and 602B that detect logic state transitions at respective nodes 528A and 5286. Transition detectors 602A and 602B may include rising edge and falling edge detectors.

In FIG. 6, metastable condition detector 104 further includes window circuits 604A and 6046 that activate respective outputs 606A and 6066 for a period of time based on outputs of respective transition detectors 602A and 602B. The period of time may be based on a transition/settling times, such as described above.

In FIG. 6, metastable condition detector 104 further includes an exclusive OR (XOR) gate 608 that activates mask control 106 when logic states at outputs 606A and 6066 differ from one another. In this example, metastable condition detector 104 activates mask control 106 when two conditions are met a logic state transition is detected at one or more of nodes 528A and 5286, and the logic states at nodes 528A and 5286 differ from one another. This may help to avoid unnecessarily activating mask control 106 when there is no mismatch amongst nodes 528A and 528B. This may be viewed as an optimization feature.

In an embodiment, XOR gate 608 compares the logic states at outputs 606A and 6066 during the same cycle in which a transition is detected.

In FIG. 1, multiple duplicate or redundant instances of evaluation circuit 102 may be provided. This may be useful as an additional check, such as to detect an error within the evaluation circuits. Examples are provided below with reference to FIGS. 7 and 8.

Figure 7:
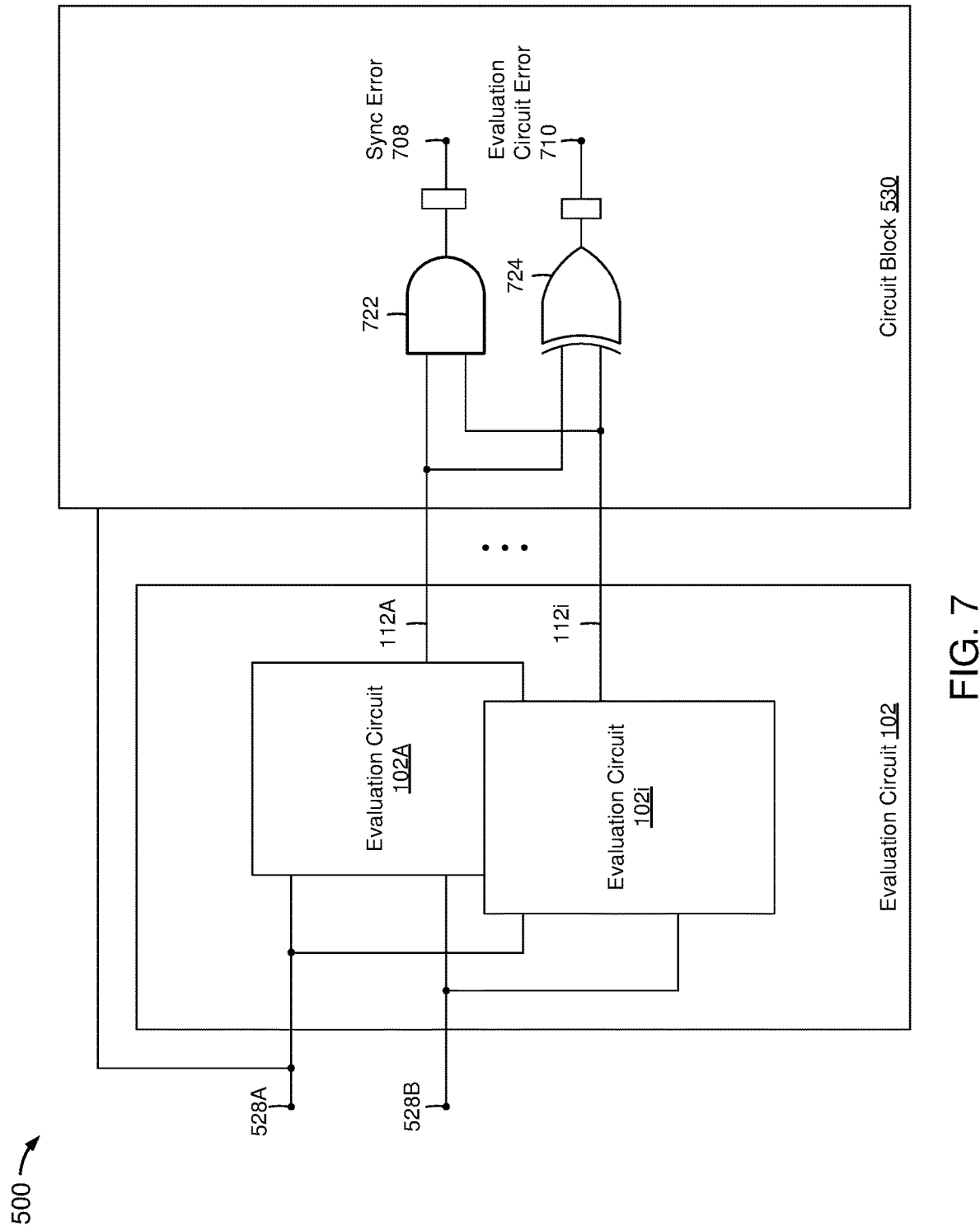
FIG. 7 is a block diagram of a portion of the asynchronous lockstep system of FIG. 5, including multiple redundant evaluation circuits, according to an embodiment.

FIG. 7 is a block diagram of a portion of system 500, according to an embodiment.

In FIG. 7, evaluation circuit 102 includes multiple evaluation circuits 102A-102$i$, which evaluate the signals at nodes 528A and 528B and output respective masked signals at outputs 112A-112$i$, such as described in one or more examples herein.

When there is no mismatch amongst nodes 528A and 528B, outputs 112A-112$i$ should be inactive. When there is a mismatch amongst nodes 528A and 528B and no metastable condition is detected, outputs 112A-112$i$ should be active. A mismatch amongst outputs 112A-112$i$ may indicate an error within one or more of evaluation circuits 102A-102$i$.

Further in FIG. 7, circuit block 530 includes evaluation circuitry that performs in accordance with Table 3, below.

TABLE 3

| 112A-112i | 708 Sync Error | 710 Evaluation Circuit Error |
|---|---|---|
| All Inactive | Inactive | Inactive |
| All Active | Active | Inactive |
| Mismatch | Inactive | Active |

In the example of FIG. 7, the evaluation circuit includes an AND gate 722 that activates a synch error signal 708 when outputs 112A-112i are active, indicating an error in one or more circuit blocks 524A and 524B (FIGS. 5 and 6).

The evaluation circuit further includes an XOR gate 724 that activates an evaluation circuit error signal 710 when there is a mismatch amongst outputs 112A-112i, indicating that there is an error in one or more of evaluation circuits 102A-102i.

Figure 8:
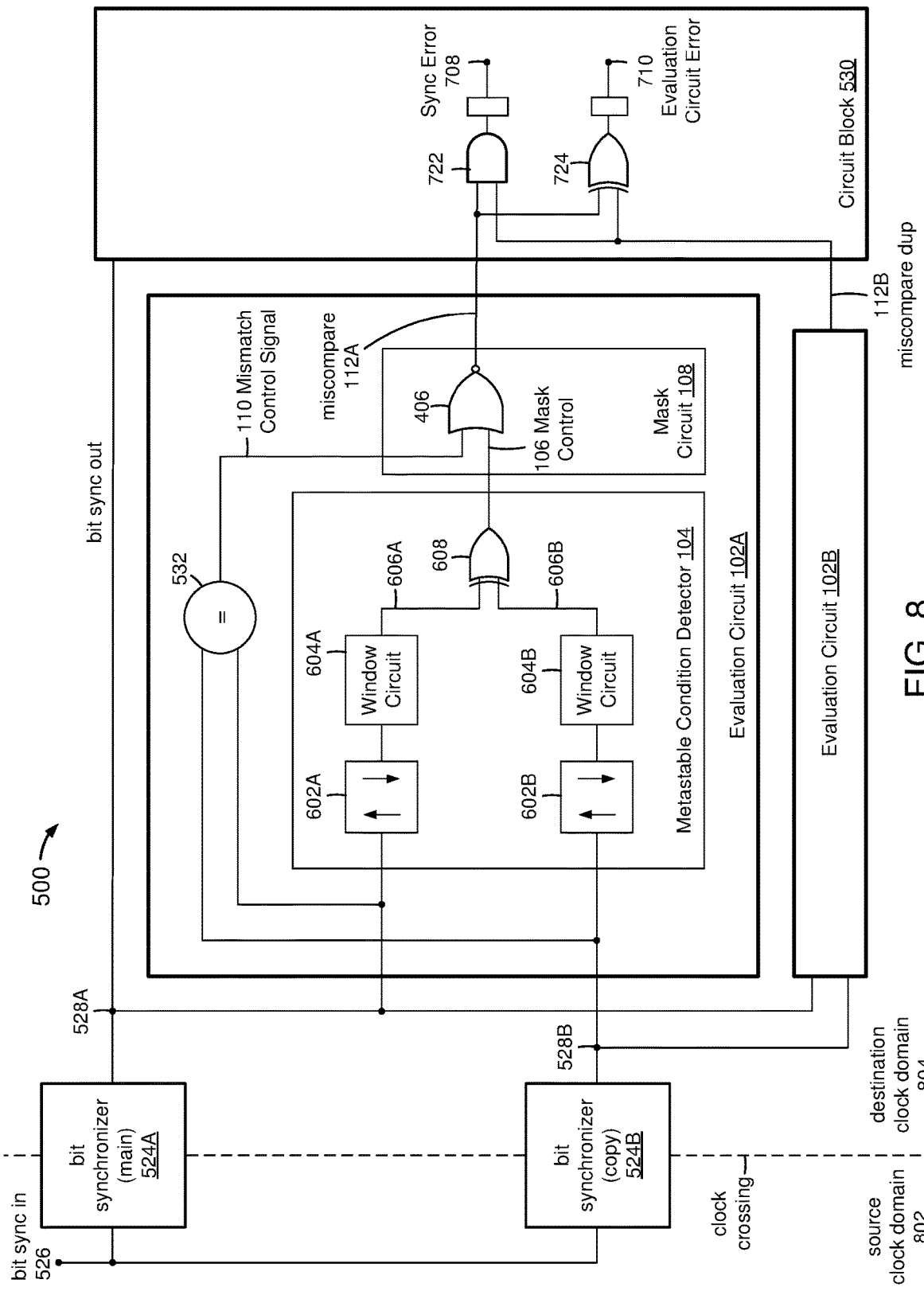
FIG. 8 is another block diagram of a portion of the asynchronous lockstep system of FIG. 5, according to an embodiment.

FIG. 8 is a block diagram of a portion of system 500, according to an embodiment. In FIG. 8, system 500 includes a source clock domain 802 and a destination clock domain 804.

Within source clock domain 802, circuit blocks 524A and 524B are illustrated as duplicate or redundant bit synchronizers that receive a bit sync in signal at node 526, and output respective signals at nodes 528A and 528B that are synchronized to destination clock domain 804.

Destination clock domain 804 includes duplicate or redundant evaluation circuits 102A and 102B, such as described above with reference to FIG. 7.

Within evaluation circuit 102A, circuitry 532 is illustrated as a comparator, metastable condition detector 104 is illustrated as in FIG. 6, and mask circuit 108 is illustrated as in FIG. 4. Circuit block 530 is illustrated as in FIG. 7.

In an embodiment, evaluation circuit 102A masks mismatch control signal 110 for a first clock cycle of destination clock domain 804 after a transition is detected.

Evaluation circuit 102B may be similar or identical to evaluation circuit 102A. Outputs 112A and 112B of evaluation circuits 102A and 102B are illustrated as miscompare and miscompare dup, respectively.

It may be possible that an error within one or more of circuit blocks 524A and 524B results in differing logic states at nodes 528A and 528B during a metastable condition. In such a situation, the error may be masked, but only for the duration of the metastable condition. If the error is persistent, it will be detectable after the metastable condition.

Figure 9:
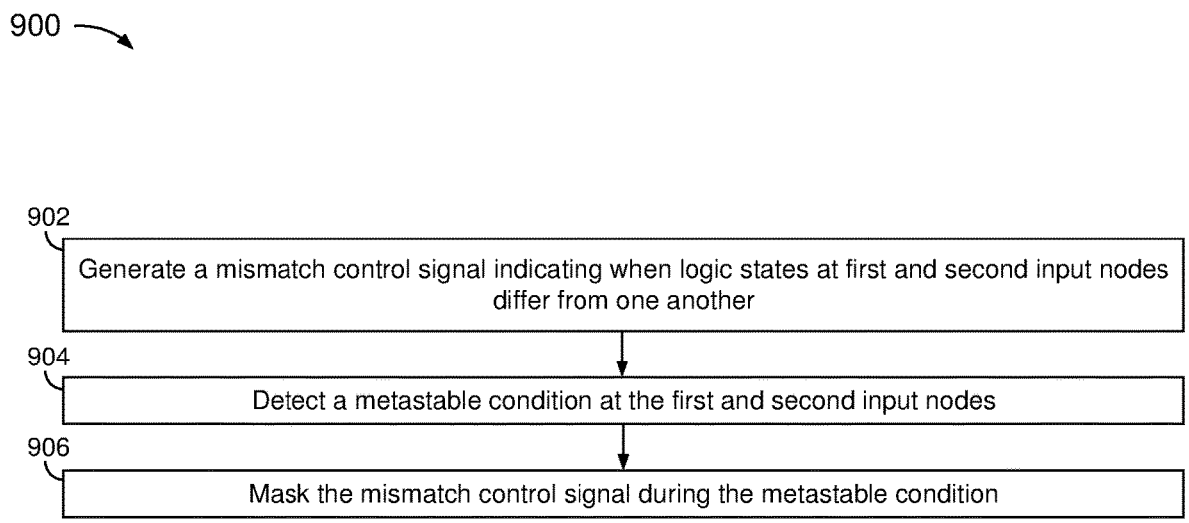
FIG. 9 is a flowchart of a method of selectively masking a signal during a metastable condition, according to an embodiment.

FIG. 9 is a flowchart of a method 900 of masking a signal during a metastable condition, according to an embodiment. Method 900 may be useful to evaluate outputs of an asynchronous lockstep system. Method 900 is not, however, limited to asynchronous lockstep applications.

Method 900 may be performed with integrated circuitry, alone and/or in combination with a processor configured with appropriate instructions. Method 900 is described below with reference to evaluation circuit 102 for illustrative purposes. Method 900 is not, however, limited to evaluation circuit 102.

At 902, circuitry 532 in FIG. 5, 6, or 8 generates or activates mismatch control signal 110 indicating when logic states at nodes 528A and 528B differ from one another.

At 904, metastable condition detector 104 in FIG. 5, 6, or 8 detects a metastable condition at nodes 528A and 528B. Metastable condition detector 104 may detect the metastable condition based on logic state transitions at nodes 528A and 528B, such as described in one or more examples herein. Metastable condition detector 104 may detect the metastable condition when a logic state transition is detected at one or more of nodes 528A and 528B and the logic states at nodes 528A and 528B differ from one another.

At 906, mask circuit 108 in FIG. 5, 6, or 8 suppresses or masks mismatch control signal 110 during the metastable condition. Mask circuit 108 may mask mismatch control signal 110 based on mask control 106 output from metastable condition detector 104.

In an embodiment, masking at 906 includes controlling an output of mask circuit 108 based on mismatch control signal 110 when no metastable condition is detected and setting mismatch control signal 110 to a predetermined logic state during the metastable condition, such as illustrated in Table 2 above.

An asynchronous lockstep system, as disclosed herein, may be configured wholly or partially within hardware.

A hardware-based asynchronous lockstep scheme may be provided at outputs of replicated circuit blocks to detect and resolve inherent and unavoidable output transition uncertainty due to metastability.

An asynchronous lockstep system may be useful in an integrated circuit device, such as a system-on-a-chip (SoC) or a field programmable gate array (FPGA). As an example, a group of configurable circuit blocks (CLBs) may be configured as lockstep circuits within a source clock domain of an FPGA, and evaluation logic may be configured within a destination clock domain of the FPGA.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the users computer, partly on the users computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An apparatus, comprising:
circuitry configured to generate a mismatch control signal indicating when logic states at first and second input nodes differ from one another;
a metastable condition detection circuit configured to detect a metastable condition at the first and second input nodes; and
a mask circuit configured to selectively mask the mismatch control signal based on an output of the metastable condition detection circuit.

2. The apparatus of claim 1, wherein the metastable condition detection circuit is further configured to detect the metastable condition based on logic state transitions at the first and second input nodes.

3. The apparatus of claim 1, wherein the metastable condition detection circuit is further configured to detect the metastable condition when a logic state transition is detected at one or more of the first and second input nodes and the logic states at the first and second input nodes differ from one another.

4. The apparatus of claim 1, wherein the mask circuit is further configured to:
control an output of the mask circuit based on the mismatch control signal when the output of the metastable condition detection circuit is inactive; and
set the mismatch control signal to a predetermined logic state when the output of the metastable condition detection circuit is active.

5. The apparatus of claim 1, wherein the metastable condition detection circuit comprises:
first and second edge detectors, each having an input coupled to a respective one of the first and second input nodes.

6. The apparatus of claim 5, wherein the metastable condition detection circuit further comprises:
   an XOR gate having inputs coupled to outputs of the first and second edge detectors.

7. The apparatus of claim 6, wherein the metastable condition detection circuit further comprises:
   a window circuit configured to extend a duration time for which the outputs of the first and second edge detectors remain active.

8. The apparatus of claim 1, wherein the mask circuit comprises a NOR gate configured to receive the mismatch control signal and the output of the metastable condition detection circuit.

9. An integrated circuit device, comprising:
   a first circuit block configured to operate under control of a first clock domain; and
   a second circuit block configured to operate under control of a second clock domain;
   wherein the first circuit block comprises first and second synchronizers, each to synchronize a digital signal to the second clock domain; and
   wherein the second circuit block comprises,
      first and second input nodes, each to receive an output of a respective one of the first and second synchronizers,
      a comparator to generate a mismatch control signal indicating when logic states at the first and second input nodes differ from one another,
      a metastable condition detection circuit configured to detect a metastable condition at the first and second input nodes, and
      a mask circuit configured to selectively mask the mismatch control signal based on an output of the metastable condition detection circuit.

10. The integrated circuit device of claim 9, wherein the metastable condition detection circuit is further configured to detect the metastable condition based on logic state transitions at the first and second input nodes.

11. The integrated circuit device of claim 9, wherein the metastable condition detection circuit is further configured to detect the metastable condition when a logic state transition is detected at one or more of the first and second input nodes and the logic states at the first and second input nodes differ from one another.

12. The integrated circuit device of claim 9, wherein the mask circuit is further configured to:
   control an output of the mask circuit based on the mismatch control signal when the output of the metastable condition detection circuit is inactive; and
   set the mismatch control signal to a predetermined logic state when the output of the metastable condition detection circuit is active.

13. The integrated circuit device of claim 9, wherein the metastable condition detection circuit comprises:
   first and second edge detectors, each having an input coupled to a respective one of the first and second input nodes.

14. The integrated circuit device of claim 13, wherein the metastable condition detection circuit further comprises:
   an XOR gate having inputs coupled to outputs of the first and second edge detectors.

15. The integrated circuit device of claim 14, wherein the metastable condition detection circuit further comprises:
   a window circuit configured to extend a duration time for which the outputs of the first and second edge detectors remain active.

16. The integrated circuit device of claim 9, wherein the mask circuit comprises a NOR gate configured to receive the mismatch control signal and the output of the metastable condition detection circuit.

17. A method, comprising:
   generating a mismatch control signal indicating when logic states at first and second input nodes differ from one another;
   detecting a metastable condition at the first and second nodes; and
   masking the mismatch control signal during the metastable condition.

18. The method of claim 17, wherein the detecting comprises:
   detecting the metastable condition based on logic state transitions at the first and second input nodes.

19. The method of claim 17, wherein the detecting comprises:
   detecting the metastable condition when a logic state transition is detected at one or more of the first and second input nodes and the logic states at the first and second input nodes differ from one another.

20. The method of claim 17, wherein the masking comprises:
   controlling an output based on the mismatch control signal in the absence of the metastable condition; and
   setting the mismatch control signal to a predetermined logic state during the metastable condition.

* * * * *